United States Patent [19]

Kawakami et al.

[11] Patent Number: 5,268,535
[45] Date of Patent: Dec. 7, 1993

[54] PRINTED WIRING BOARD

[75] Inventors: Shin Kawakami; Satoshi Haruyama; Hirotaka Okonogi, all of Saitama, Japan

[73] Assignee: Nippon CMK Corp., Japan

[21] Appl. No.: 739,707

[22] Filed: Aug. 2, 1991

[30] Foreign Application Priority Data

Aug. 10, 1990 [JP] Japan ................................ 2-213147

[51] Int. Cl.⁵ ............................................. H05K 1/00
[52] U.S. Cl. ..................................... 174/250; 174/256
[58] Field of Search ............... 174/250, 255, 256, 257, 174/258

[56] References Cited

U.S. PATENT DOCUMENTS 5,041,700  8/1991  Iyogi et al. ................. 174/255
5,102,749  4/1992  Enloe et al. ................. 174/250

Primary Examiner—Leo P. Picard
Assistant Examiner—Cheryl R. Figlin
Attorney, Agent, or Firm—Bruce L. Adams; Van C. Wilks

[57] ABSTRACT

A printed wiring board has a substrate having an outer peripheral edge. A printed circuit is formed on at least one side of the substrate. A shock-absorbing band formed of copper foil is disposed along at least a portion of the outer peripheral edge of at least one side of the substrate and is effective to absorb at least some of the impact applied to the printed wiring board during cutting thereof.

16 Claims, 1 Drawing Sheet

PRINTED WIRING BOARD

BACKGROUND OF THE INVENTION

The present invention is related to a printed wiring board, and particularly to the reinforcement of printed circuits in the work such as the outer shaping work of the printed wiring board by a press die.

Typically, a printed wiring board of the prior art has printed circuits provided one or both sides of a substrate.

In addition, when forming printed circuits in the printed wiring board of the above described construction, an edge of 0.4 mm is usually left along the outer periphery of the substrate and a pattern is formed inside thereof insure electrical reliability and safety. The requirement depends on the use of the board.

Further, the thickness of the substrate is usually 1.6 mm, and consists of, a paper phenol, glass epoxy or composite epoxy material. Outer shaping work is performed monolithically by a press-cutting method using a press die.

Since the material of the substrate is hard when it is a glass epoxy or composite epoxy material, the cutting by a press die has some difficulty, but such material is generally used in view of productivity and cost.

SUMMARY OF THE INVENTION

However, cracks occur less in the outer shaping work if the substrate is made of paper phenol. On the other hand, glass epoxy and composite epoxy materials require careful cutting work by a press die because the materials themselves are hard and reinforced by glass fibers. The glass fibers in the substrate are pulled by the shear pressure of the top force of the press die and cracks occur due to the distortion.

Such cracks randomly occur in the vicinity of the outer edge due to irregularities in the first patterns of the weave in the left and right directions due to the effect of the glass fiber shape. These cracks cut the printed circuits formed near the outer edge, or the cracks having occurred in a position near the printed circuits cause the deterioration of insulation over time between the circuits in the printed circuits.

Accordingly, the present invention was developed in view of the above described defects in the conventional outer shaping work by a press die. An object of the present invention is to provide a printed wiring board which can prevent the occurrence of cracks disposed on such work.

The printed wiring board of the present invention is a printed wiring board comprising printed circuits formed on one, or both sides of a substrate. A shock-absorbing band is provided comprised of a copper foil in the substrate along the outer peripheral edge of at least one side thereof.

In accordance with the printed wiring board of the present invention, shear impact occurring during the press work is absorbed by the shock-absorbing band comprised of a copper foil provided along the outer peripheral edge of the substrate.

BRIEF DESCRIPTION OF THE DRAWING

FIGS. 1 and 2 show the embodiment of the printed wiring board of the present invention, in which FIG. 1 is a plan view of the printed wiring board part of which is omitted; and FIG. 2 is a partially enlarged cross-sectional view of the same.

DETAILED DESCRIPTION OF THE PREFERRED EMBODIMENTS

Figure 1:
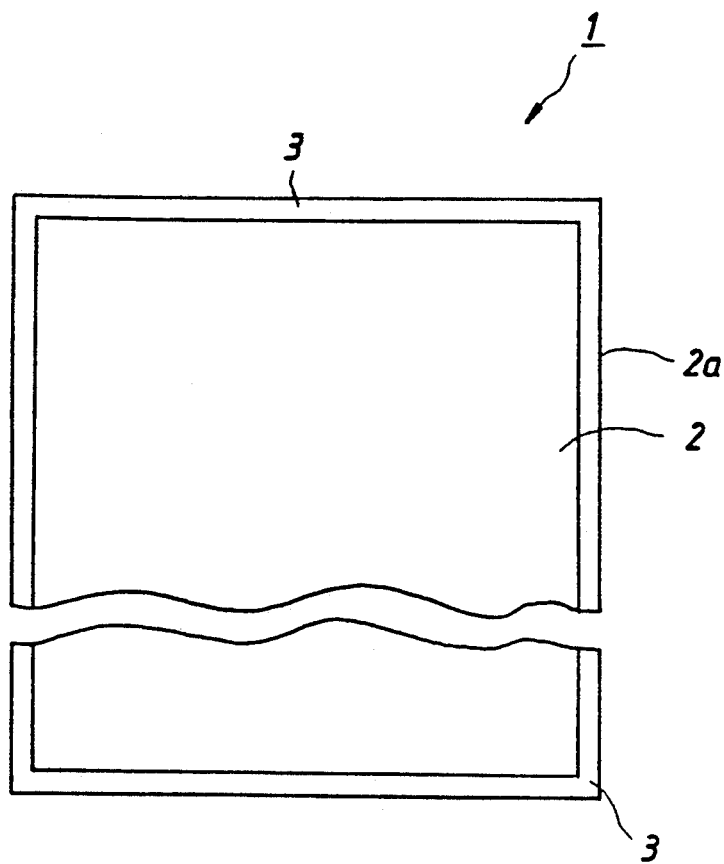

Now, the embodiment of the printed wiring board of the present invention is described in conjunction with the drawing.

Figure 2:
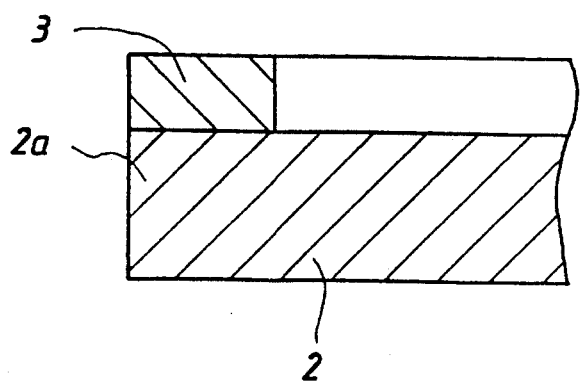

FIGS. 1 and 2 show the embodiment of the printed wiring board of the present invention, in which FIG. 1 is a plan view of the printed wiring board part of which is omitted, and FIG. 2 is a partially enlarged cross-sectional view of the same.

1 represents a printed wiring board, in which desired printed circuits (not shown) are formed by the conventional manufacturing process using a single-sided copper-clad laminate (copper foil: 35 $\mu$m, substrate: 1.6 mm-thick glass epoxy material) and a 0.4 mm-wide shock-absorbing band 3 is formed along the outer peripheral edge 2a of a substrate 2.

When press die work is performed on the printed wiring board 1 provided with the shock-absorbing band 3 comprised of a copper foil along the outer peripheral edge 2a of the substrate 2, for instance, if the outer shaping work is carried out cutting using press die, the shear impact due to the press work can be absorbed to protect the printed circuits formed inside the shock-absorbing band 3, thereby preventing the breaking of the printed circuits while also preventing the occurrence of the cracking of the substrate 2 itself.

That is the shock-absorbing band 3 strongly bonds with the substrate 2 and has an action of absorbing the distortion generated by the cutting by the press die in conjunction with the flexibility of the copper foil itself, whereby the occurrence of cracks or the effect of the cracking on the printed circuits can be prevented.

Incidentally, 100 printed wiring boards 1 of such construction were applied with an outer shaping work by a press die (hydraulic type of 110$t$), and as a result, it was confirmed that no effect by cracks was found in the patterns spaced from the shock-absorbing band 3 by 0.2 mm. When an outer shaping work was applied by a similar method to the printed wiring boards of the above printed wiring boards 1 which had no shock-absorbing band 3 provided therein, it was confirmed that the occurrence of cracks and the effect of the cracks to 5 mm inside the outer peripheral edge were found in 87% of them.

The size of the above-mentioned printed wiring boards used in the experiment was 250×250 mm².

In addition, although the shock-absorbing band 3 need not have the same width over the whole circumference, it preferably has a width of 0.3 mm or greater and may also serve as a printed circuit (for instance, it can be used as the ground circuit of a printed circuit).

Moreover, the shock absorbing band 3 can be discontinuous or continuous around the peripheral edge 2a.

Further, the above described embodiment has been explained for a single-sided printed wiring board, but in a double-sided printed wiring board, if printed circuits are provided on both surfaces of the substrate 2, the implementation can be made by providing the shock-absorbing band 3 on both surfaces as well as providing the shock-absorbing band 3 on either surface.

In accordance with during printed wiring board of the invention, the shock-absorbing band can prevent the breaking or insulation deterioration of printed circuits in the press work and reinforce the mechanical strength (strength against warp, twist, etc.) of the printed circuits.

What is claimed is:

1. A printed wiring board, comprising: printed circuits formed on at least one side of a substrate; and a shock-absorbing band comprised of a copper foil disposed on said substrate along the outer peripheral edge of at least one side thereof.

2. A printed wiring board according to claim 1; wherein said shock-absorbing band has a width of 0.3 mm or greater.

3. A printed wiring board according to claim 1; wherein said shock-absorbing band is formed when said printed circuits are formed.

4. A printed wiring board according to claim 1; wherein said shock-absorbing band consists of the ground circuit of said printed circuits formed along the outer peripheral edge of said substrate.

5. A printed wiring board according to claim 1; wherein said substrate is comprised of a hard material such as a glass epoxy or composite epoxy material.

6. A printed wiring board, comprising: a substrate having an outer peripheral edge; a printed circuit formed on at least one side of the substrate; and a shock-absorbing band disposed along at least a portion of the outer peripheral edge of at least one side of the substrate effective to absorb impact forces subsequently applied to the printed wiring board during cutting thereof.

7. A printed wiring board according to claim 6; wherein the shock-absorbing band is disposed along the entire outer peripheral edge.

8. A printed wiring board according to claim 6; wherein the shock-absorbing band is disposed discontinuously along at least a portion of the outer peripheral edge.

9. A printed wiring board according to claim 6; wherein the shock-absorbing band is comprised of copper foil.

10. A printed wiring board according to claim 6; wherein the shock-absorbing band is a part of the printed circuit.

11. A printed wiring board according to claim 10; wherein the shock-absorbing band is a ground circuit of the printed wiring board.

12. A printed wiring board according to claim 6; wherein the shock-absorbing band is disposed on both sides of the substrate.

13. A printed wiring board according to claim 6; wherein the shock-absorbing band is formed when forming the printed circuit.

14. A printed wiring board according to claim 6; wherein the shock-absorbing band is disposed continuously along the outer peripheral edge.

15. A printed wiring board according to claim 6; wherein the substrate comprises one of a glass epoxy and a composite epoxy.

16. A printed wiring board according to claim 6; wherein the shock-absorbing band has a width of at least 0.3 mm.

* * * * *